(12) United States Patent
Daamen et al.

(10) Patent No.: US 9,941,222 B2
(45) Date of Patent: *Apr. 10, 2018

(54) INTEGRATED CIRCUIT WITH SENSOR AND METHOD OF MANUFACTURING SUCH AN INTEGRATED CIRCUIT

(71) Applicant: ams International AG, Rapperswil-Jona (CH)

(72) Inventors: Roel Daamen, Herkenbosch (NL); Robertus Adrianus Maria Wolters, Eindhoven (NL); Rene Theodora Hubertus Rongen, Nijmegen (NL); Youri Victorovitch Ponomarev, Leuven (BE)

(73) Assignee: ams International AG, Rapperswil-Jona (CH)

( * ) Notice: Subject to any disclaimer, the term of this patent is extended or adjusted under 35 U.S.C. 154(b) by 0 days.

This patent is subject to a terminal disclaimer.

(21) Appl. No.: 15/069,898

(22) Filed: Mar. 14, 2016

(65) Prior Publication Data
US 2016/0197047 A1      Jul. 7, 2016

Related U.S. Application Data

(63) Continuation of application No. 13/398,158, filed on Feb. 16, 2012, now Pat. No. 9,284,187.

(30) Foreign Application Priority Data

Feb. 22, 2011    (EP) .................................... 11155468

(51) Int. Cl.
*H01L 29/66*    (2006.01)
*H01L 23/00*    (2006.01)
(Continued)

(52) U.S. Cl.
CPC ........ *H01L 23/564* (2013.01); *B81C 1/00246* (2013.01); *H01L 21/4853* (2013.01);
(Continued)

(58) Field of Classification Search
CPC .......... H01L 21/02; H01L 24/02; H01L 29/66
See application file for complete search history.

(56) References Cited

U.S. PATENT DOCUMENTS 4,057,823  A    11/1977  Burkhardt et al.
6,670,705  B1   12/2003  Harris et al.
(Continued)

FOREIGN PATENT DOCUMENTS

CN    1373902 A    10/2002
EP    2 282 333 A1  2/2011
(Continued)

OTHER PUBLICATIONS

A Paskaleva,"Impact of Si substrate nitridation on electrical characteristics of Ta2O5 stack capacitors," J. Phys. D: Appl. Phys. 40 (2007) 6709-6717.
(Continued)

*Primary Examiner* — Thomas L Dickey
(74) *Attorney, Agent, or Firm* — McDermott Will & Emery LLP

(57) ABSTRACT

Disclosed is an integrated circuit comprising a substrate carrying a plurality of circuit elements; a metallization stack interconnecting said circuit elements, said metallization stack comprising a patterned upper metallization layer comprising a first metal portion; a passivation stack covering the metallization stack; and a sensor including a sensing material on the passivation stack, said sensor being coupled to the first metal portion by a via extending through the passivation stack. A method of manufacturing such an IC is also disclosed.

8 Claims, 9 Drawing Sheets

Figure 1:
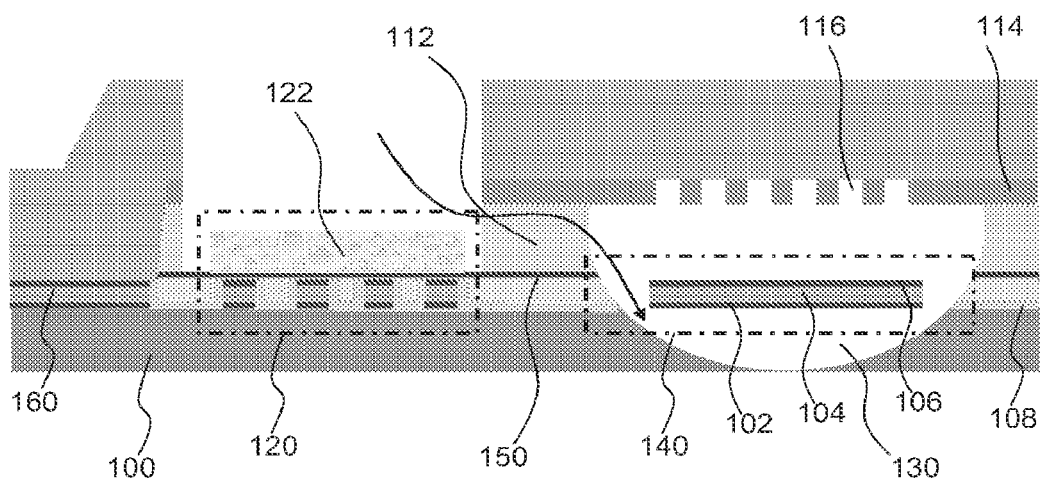

(51) Int. Cl.
*B81C 1/00* (2006.01)
*H01L 21/48* (2006.01)
*H01L 21/56* (2006.01)
*H01L 21/66* (2006.01)
*H01L 23/31* (2006.01)
*H01L 23/498* (2006.01)

(52) U.S. Cl.
CPC .............. *H01L 21/56* (2013.01); *H01L 22/34* (2013.01); *H01L 23/3192* (2013.01); *H01L 23/49811* (2013.01); *B81C 2203/0714* (2013.01); *H01L 2924/0002* (2013.01)

(56) References Cited

U.S. PATENT DOCUMENTS

| | | | |
|---|---|---|---|
| 6,813,944 B2 | 11/2004 | Mayer et al. | |
| 7,514,760 B1 | 4/2009 | Quevy | |
| 7,709,912 B2 | 5/2010 | Sato et al. | |
| 8,143,729 B2 | 3/2012 | Pavier et al. | |
| 9,284,187 B2 * | 3/2016 | Daamen .............. | B81C 1/00246 |
| 2003/0049877 A1 | 3/2003 | Mayer et al. | |
| 2007/0018761 A1 | 1/2007 | Yamanaka et al. | |
| 2008/0105951 A1 | 5/2008 | Sato et al. | |
| 2008/0237469 A1 | 10/2008 | Oda et al. | |
| 2009/0218684 A1 | 9/2009 | Pavier et al. | |
| 2010/0155949 A1 | 6/2010 | Jain | |
| 2010/0301398 A1 * | 12/2010 | Rothberg ........... | G01N 27/4145 257/253 |
| 2011/0079649 A1 | 4/2011 | Daamen et al. | |
| 2011/0146400 A1 | 6/2011 | Humbert et al. | |
| 2011/0207239 A1 | 8/2011 | Daamen et al. | |
| 2011/0296912 A1 | 12/2011 | Merz et al. | |

FOREIGN PATENT DOCUMENTS

| | | |
|---|---|---|
| WO | 01/84099 A1 | 11/2001 |
| WO | 2007/036922 A1 | 4/2007 |
| WO | 2010049881 A1 | 5/2010 |

OTHER PUBLICATIONS

Office Action from counterpart application CN201210037533.8 (dated Feb. 27, 2014).

Extended European Search Report for European patent appin. No. 11155468.9 (dated Jul. 22, 2011).

* cited by examiner (d)

(e)

(f)

INTEGRATED CIRCUIT WITH SENSOR AND METHOD OF MANUFACTURING SUCH AN INTEGRATED CIRCUIT

CROSS-REFERENCE TO RELATED APPLICATIONS

This application is a continuation of U.S. application Ser. No. 13/398,158, filed on Feb. 16, 2012, which claims priority under 35 U.S.C. § 119 of European Patent Application No. 11155468.9, filed on Feb. 22, 2011, both of which are hereby incorporated by reference in their entirety.

DESCRIPTION

The present invention relates to an integrated circuit (IC) comprising a substrate carrying a plurality of circuit elements; a metallization stack interconnecting said circuit elements, said metallization stack comprising a patterned upper metallization layer comprising a first metal portion; a passivation stack covering the metallization stack; and a sensor.

The present invention further relates to a method of manufacturing such an IC.

Nowadays, integrated circuits (ICs) may comprise moisture-sensitive sensors, such as relative humidity (RH) sensors or liquid immersion detection sensors. Such sensors may be included in the IC design for a number of reasons.

For instance, such a sensor may be included in the ICs to determine whether a malfunctioning IC that has been returned, e.g. to its manufacturer, has been damaged by exposure to moisture, e.g. an immersion event, or whether the IC itself is faulty. The determination of such external influences as a cause of malfunction may be of crucial importance to deciding whether or not the customer returning the IC or an electronic device including the IC is entitled to a warranty claim on the device, as misuse such as the aforementioned immersion event typically invalidates the warranty.

Alternatively, such a sensor may be part of the functionality of an IC. There is for instance a trend towards providing near-field communication ICs such as radio-frequency (RF) identification (ID) chips with a range of sensors, such as temperature sensors, ambient light sensors, mechanical shock sensors, liquid immersion sensors, humidity sensors, $CO_2$ sensors, $O_2$ sensors, pH sensors and ethylene sensors, which for instance may be used to monitor the ambient conditions of a product tagged with the chip such that product quality control can be achieved by monitoring the sensor readings of the chip.

It is particularly attractive to integrate at least some of these sensors in the back-end of the manufacturing process of an IC, such as in the metallization stack, as this facilitates a cost-effective route to such integration due to the fact that such integration can be achieved with minimal alteration to the process flow.

However, one of the challenges IC designers are faced with when integrating multiple sensors into the metallization stack is that environmental sensors have to be in communicative contact with the environment. This increases the risk that moisture penetrates the metallization stack and interferes with the correct operation of the underlying circuit elements of the IC. To this end, a moisture barrier layer such as a $Ta_2O_5$ layer or a passivation layer may be deposited over the metallization stack to protect the underlying circuitry from exposure to moisture. Unfortunately, when integrating multiple sensors with different functionality in the metallization layer, the partial removal of such a barrier layer cannot always be avoided.

An example of such a multi-sensor IC is shown in FIG. 1, in which an environmental sensor 120 having a transducer 122 and a shock sensor 140 are formed in a top metal layer of a metallization stack of the IC, the underlying layers of which are schematically depicted by a single layer 100 for the sake of clarity only. Such a top metallization layer may for instance comprise a stack of metal layers such as an AlCu layer 104 sandwiched between TiTiN layers 102 and 106. A bond pad 160 is also shown by way of example only.

A passivation stack comprises a moisture-impenetrable layer 150 such as a $Ta_2O_5$ layer, an oxide layer 112 and a nitride layer 114, which covers the IC and protects it from damage, e.g. from moisture penetrating the IC and interfering with the correct operation of the active circuitry. However, the consequence of the formation of the cavity 130 in which the sensor 140 is placed means that the a moisture-impenetrable layer 150 has been disrupted, as such cavities are typically formed by providing a number of openings 116 in the nitride layer 114 above the sensor 140 and etching away the oxide 112 as well as the moisture-impenetrable layer 150 surrounding the sensor 140 to form the cavity 130.

Consequently, as the environmental sensor 120 has to be exposed to the environment, i.e. by opening the passivation stack above the transducer 122, a path exists for moisture to penetrate the IC through this opening, the relatively porous oxide layer 112 exposed in this opening and the cavity 130, as indicated by the arrow in FIG. 1. This is of course unwanted as such moisture penetration can detrimentally affect the operation of the IC as previously explained.

U.S. Pat. No. 4,057,823 discloses an example of an environmental sensor, i.e. a structure for a relative humidity monitor which can be built into an integrated circuit chip. A small area on a silicon chip is made porous by anodic etching. This region is then oxidized and a metal counter electrode is deposited over part of the porous area. Due to the relatively large surface area in the dielectric under the counter electrode and the openness of the structure, ambient moisture can quickly diffuse into the dielectric under the electrode and adsorb onto the silicon dioxide surface, such that changes in ambient humidity will be reflected by measurable changes in capacitance or conductance of the device.

It is clear that there is a desire for the integration of a variety of sensors onto an IC for a number of reasons, some of which have been presented above. However, the integration of moisture-sensitive sensors is not without problems, as it proves difficult to protect the other circuitry of the IC from exposure to moisture, at least in a cost-effective manner.

SUMMARY OF THE INVENTION

The present invention seeks to provide an IC comprising a sensor which is less prone to suffer from moisture penetrating the metallization stack.

The present invention further seeks to provide a method of manufacturing such an IC.

According to a first aspect of the present invention, there is provided an integrated circuit comprising a substrate carrying a plurality of circuit elements; a metallization stack interconnecting said circuit elements, said metallization stack comprising a patterned upper metallization layer comprising a first metal portion; a passivation stack covering the metallization stack; and a sensor including a sensing material on the passivation stack, said sensor being coupled to the first metal portion by a via extending through the passivation stack.

The present invention has been based on the realization that the provision of a sensing material such as a moisture-sensitive material can be provided on the outside of the passivation layer, with the material connected to the underlying circuit elements through the metallization stack and at least one via extending through the passivation stack. This novel way of using vias for interconnection purposes (vias are typically used for interconnecting different metallization layers in a metallization stack) ensures that the passivation layer remains substantially impenetrable to moisture, thereby protecting the underlying metallization and circuit elements from malfunction.

Preferably, the sensor further comprises an electrode on the passivation stack, said electrode being conductively coupled to said via, as this improves the sensitivity of the sensor.

In an embodiment, the via comprises tungsten. This has the advantage that the via may be realized using processing steps already available in the manufacturing process flow of the IC, as tungsten is commonly used for the formation of vias in the metallization stack, such as for instance in CMOS processes.

In case the IC requires one of more bond pads, the IC typically comprises a bond pad portion in the upper metallization layer. Access to this contact may be provided by the passivation stack comprising an opening at least partially exposing the bond pad portion. In this case it may be advantageous that the passivation stack further comprises a moisture-impenetrable guard ring surrounding said opening, said guard ring extending onto the bond pad portion to prevent moisture from penetrating the metallization stack through said opening. Alternatively, the IC may comprise a bond pad on said passivation stack, said bond pad being conductive coupled to the bond pad portion by a further via extending through the passivation stack, which has the advantage that the risk of moisture penetration via the bond pad region is reduced in a cost-effective manner.

In an embodiment, the sensor further comprises a second electrode on the passivation stack, wherein the upper metallization layer comprises a second metal portion conductively coupled to the second electrode by a second via extending through the passivation layer, the first electrode and the second electrode being electrically insulated from each other by the sensing material, and wherein the sensing material has a variable dielectric constant as a function of relative humidity. This facilitates the determination of relative humidity in a straightforward and cost-effective manner without significantly increasing the risk of moisture penetrating the IC.

The passivation stack may further comprise a $Ta_2O_5$ layer, said sensing material being formed on said $Ta_2O_5$ layer, as this further improves the moisture protection of the IC due to the moisture-impenetrable nature of $Ta_2O_5$.

In accordance with another aspect of the present invention, there is provided a method of manufacturing an integrated circuit, comprising providing a substrate carrying a plurality of circuit elements; forming a metallization stack interconnecting said circuit elements, said metallization stack comprising a patterned upper metallization layer comprising a first metal portion; forming a passivation stack covering the metallization stack; forming a trench in the passivation stack to expose the first metal portion; forming a via in said trench; and forming a sensor including a sensing material on the passivation stack over said via.

This method can be implemented in most IC manufacturing processes without requiring significant redesign of the manufacturing process, such that an IC extended with sensor functionality whilst at the same time being robust in terms of moisture penetration can be provided in a cost-effective manner.

Preferably, the step of forming said sensor comprises forming a first electrode on the passivation stack, wherein the first electrode is conductively coupled to the via. This improves the sensitivity of the sensor.

The patterned upper metallization layer may comprise a second metal portion, the step of forming said trench may further comprise forming a further trench exposing the second metal portion, the step of forming said via may further comprise forming a second via in the further trench and the step of forming said sensor may further comprise forming a second electrode on the passivation stack electrically insulated from the first electrode by the sensing material, wherein the second electrode is conductively coupled to the second via. This allows for the formation of a relative humidity sensor on top of the passivation stack, such that the passivation stack does not require a permanent opening to provide the IC with such sensing functionality, thereby protecting the IC from unwanted moisture penetration into the metallization stack and underlying circuit elements.

In an embodiment, the upper metallization layer further comprises a bond pad portion, and wherein the method further comprises forming an opening in the passivation stack at least partially exposing said bond pad. Preferably, the method further comprises forming a moisture-impenetrable guard ring in the passivation stack around said opening, said guard ring extending onto the bond pad portion such that the opening is adequately protected against moisture penetrating the metallization stack through the sidewalls of the opening.

Alternatively, the method further comprises forming a further via in said opening and forming a bond pad on the passivation stack that is conductively coupled to the further via such that the passivation stack does not require a permanent opening to provide access to the bond pad.

BRIEF DESCRIPTION OF THE EMBODIMENTS

Figure 2:
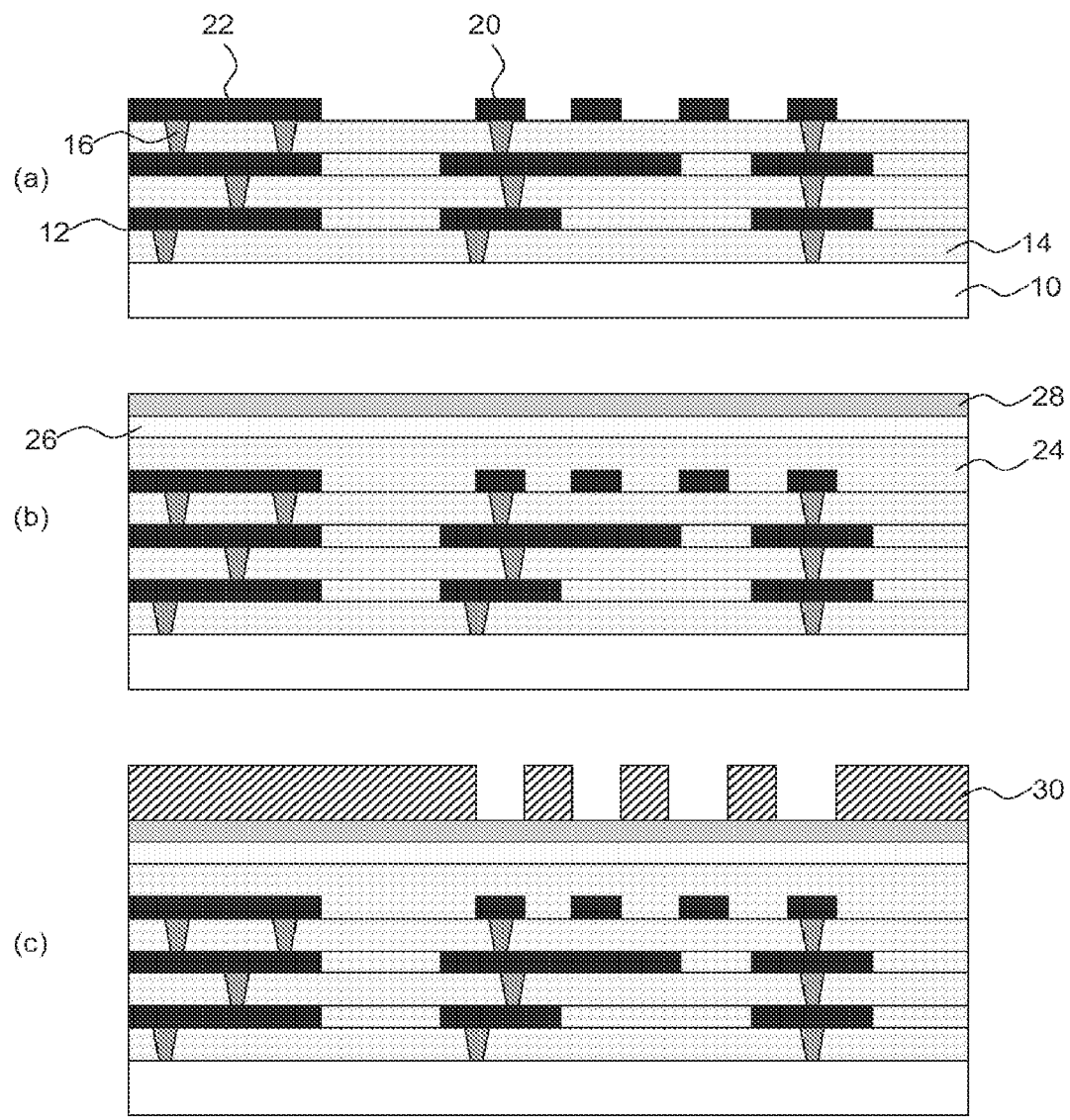
Figure 2:
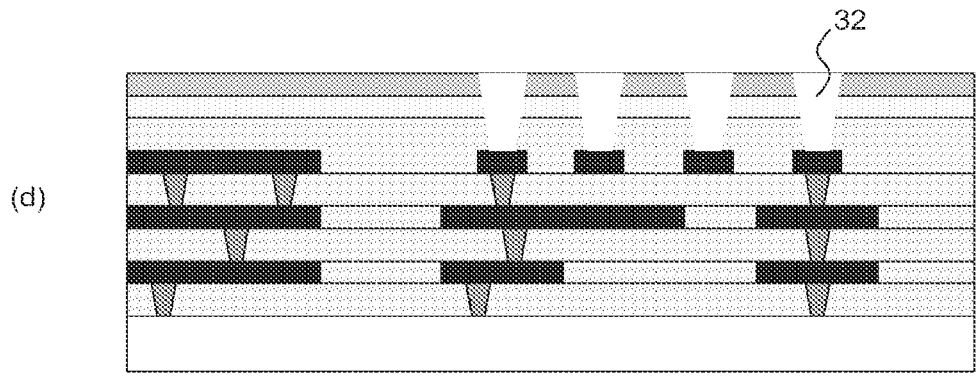
Figure 2:
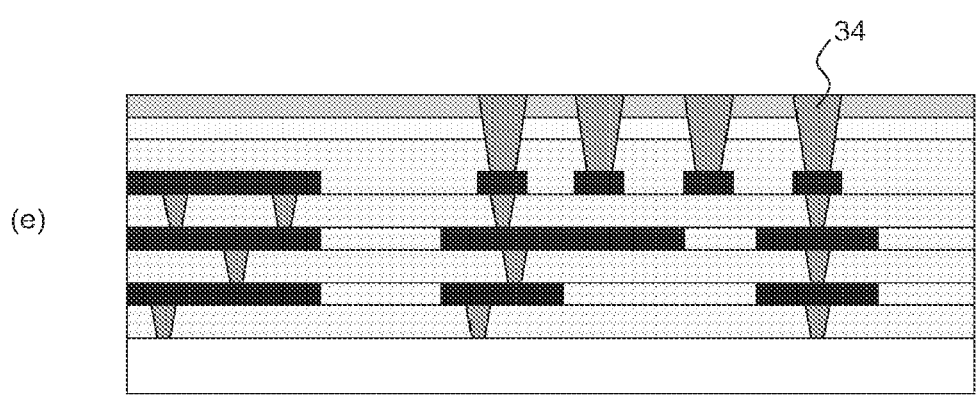
Figure 2:
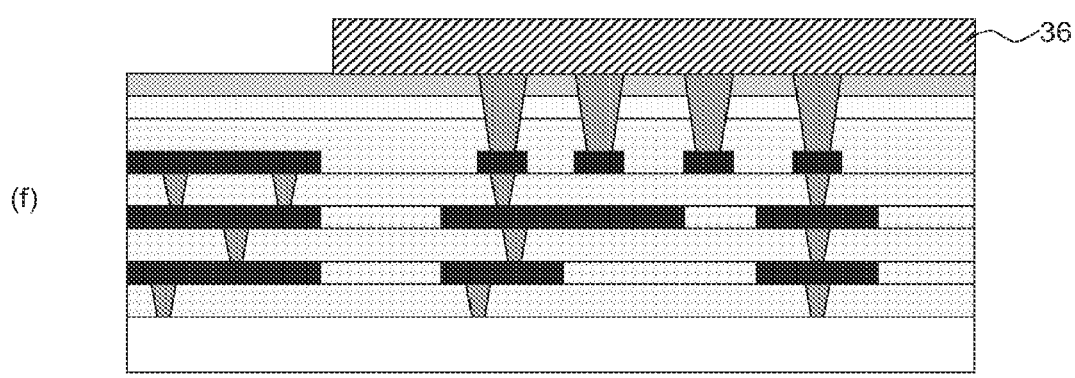
Figure 2:
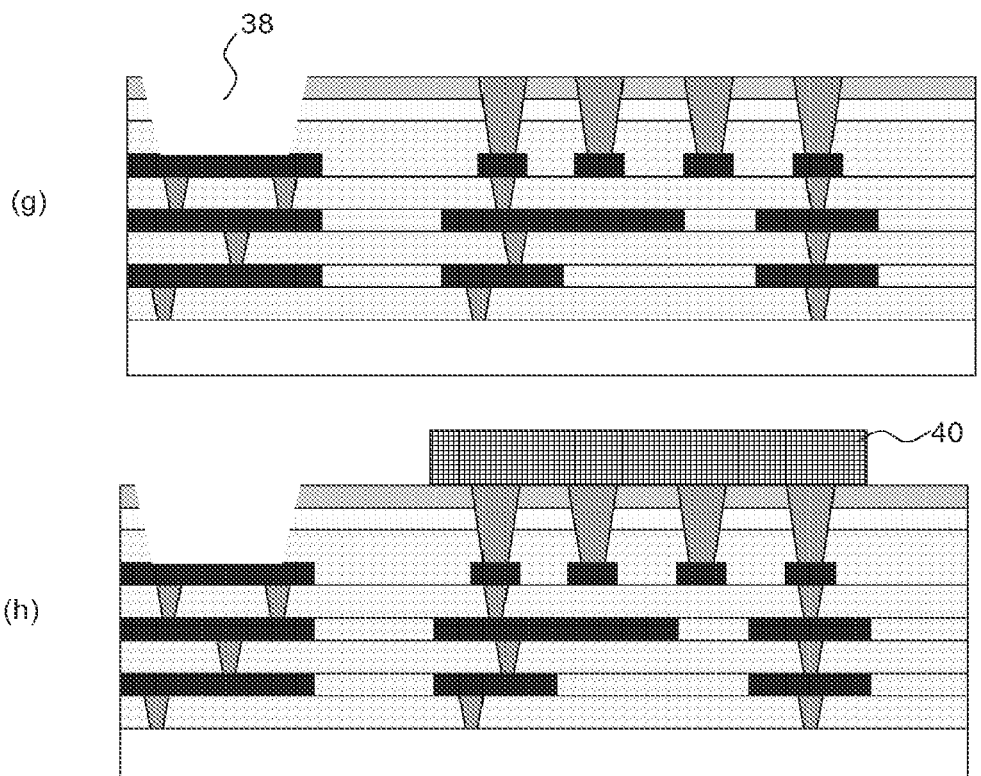
Figure 3:
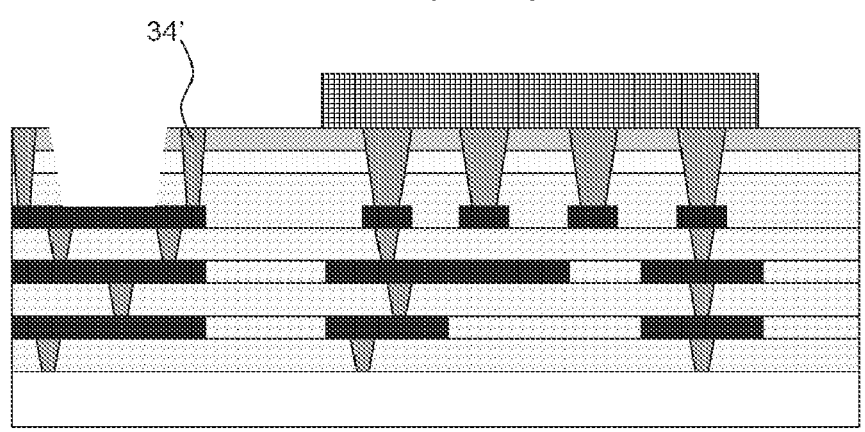
Figure 4:
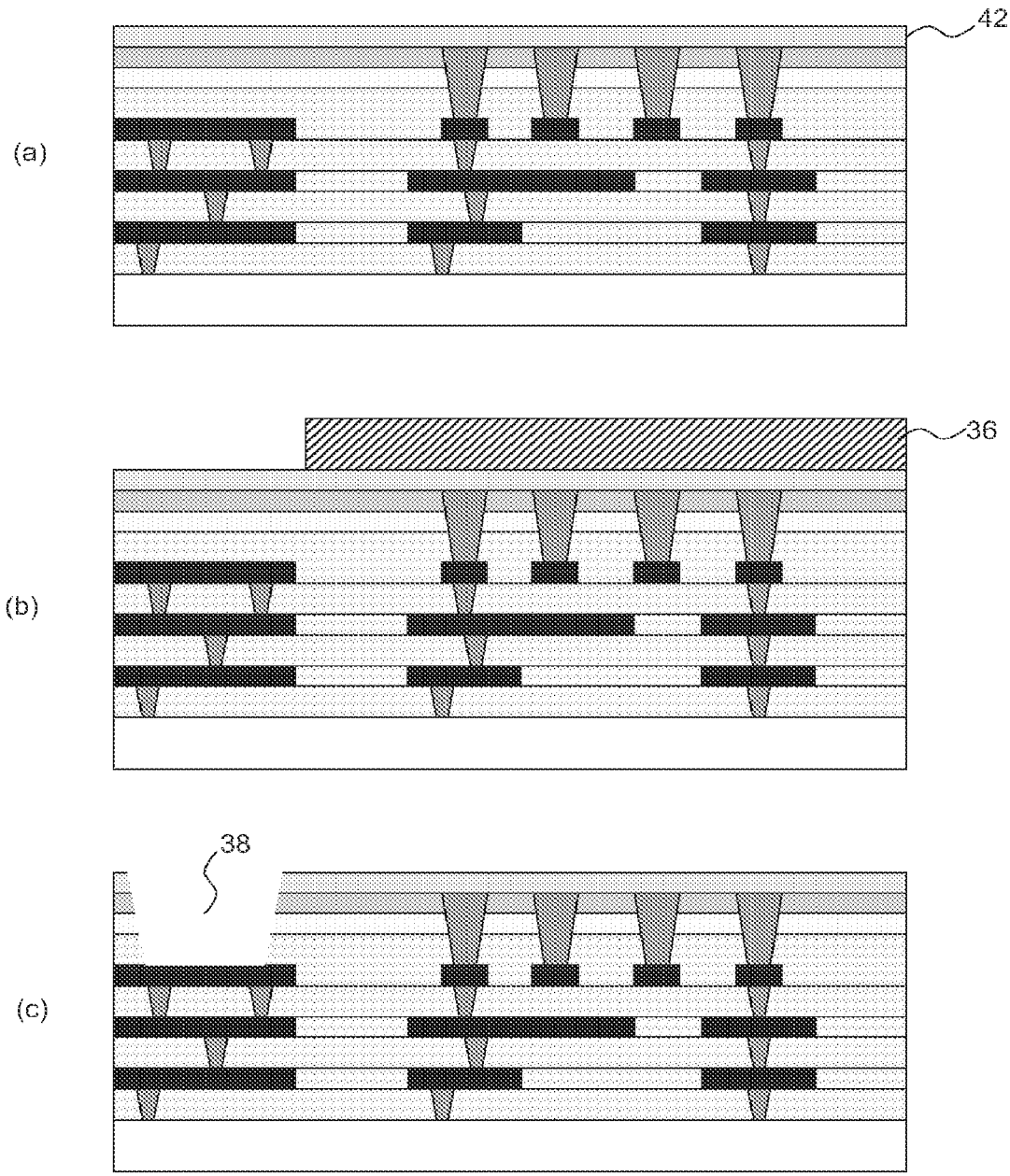
Figure 4:
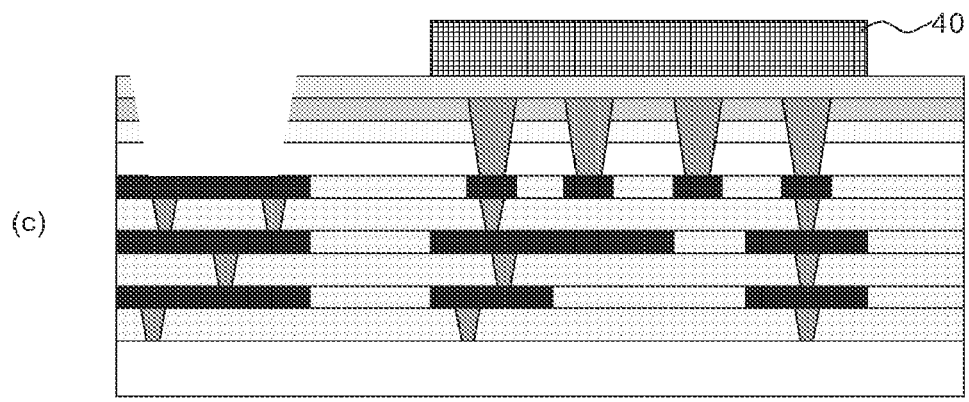
Figure 5:
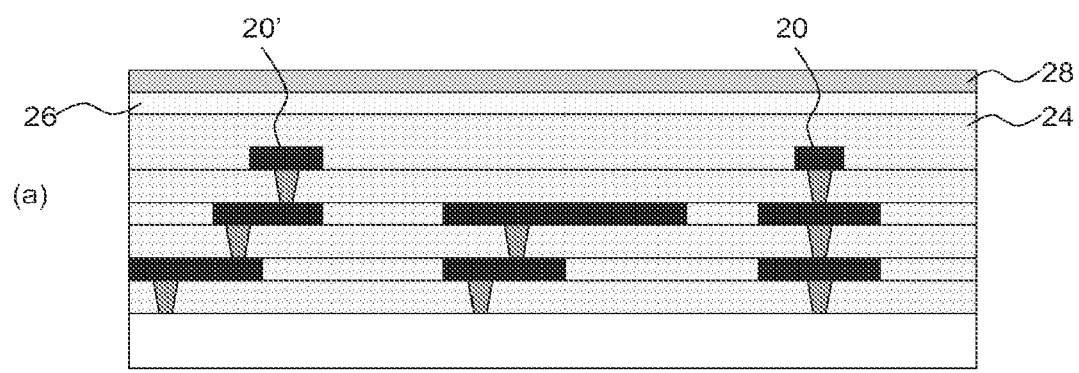
Figure 5:
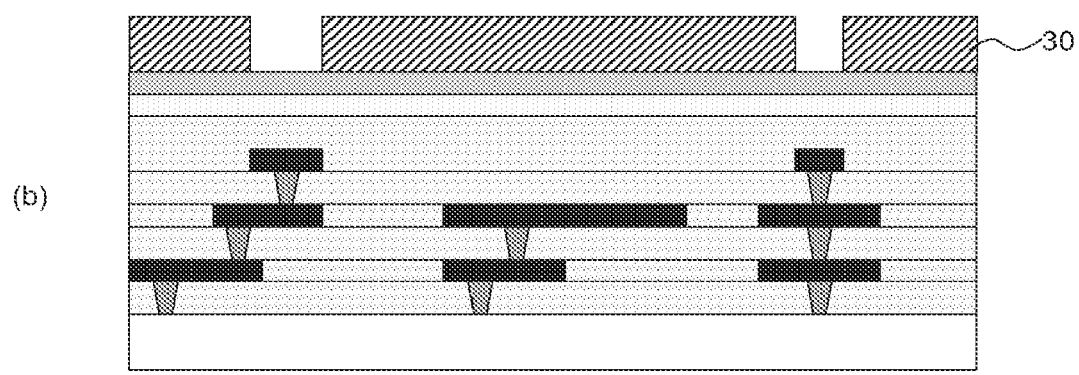
Figure 5:
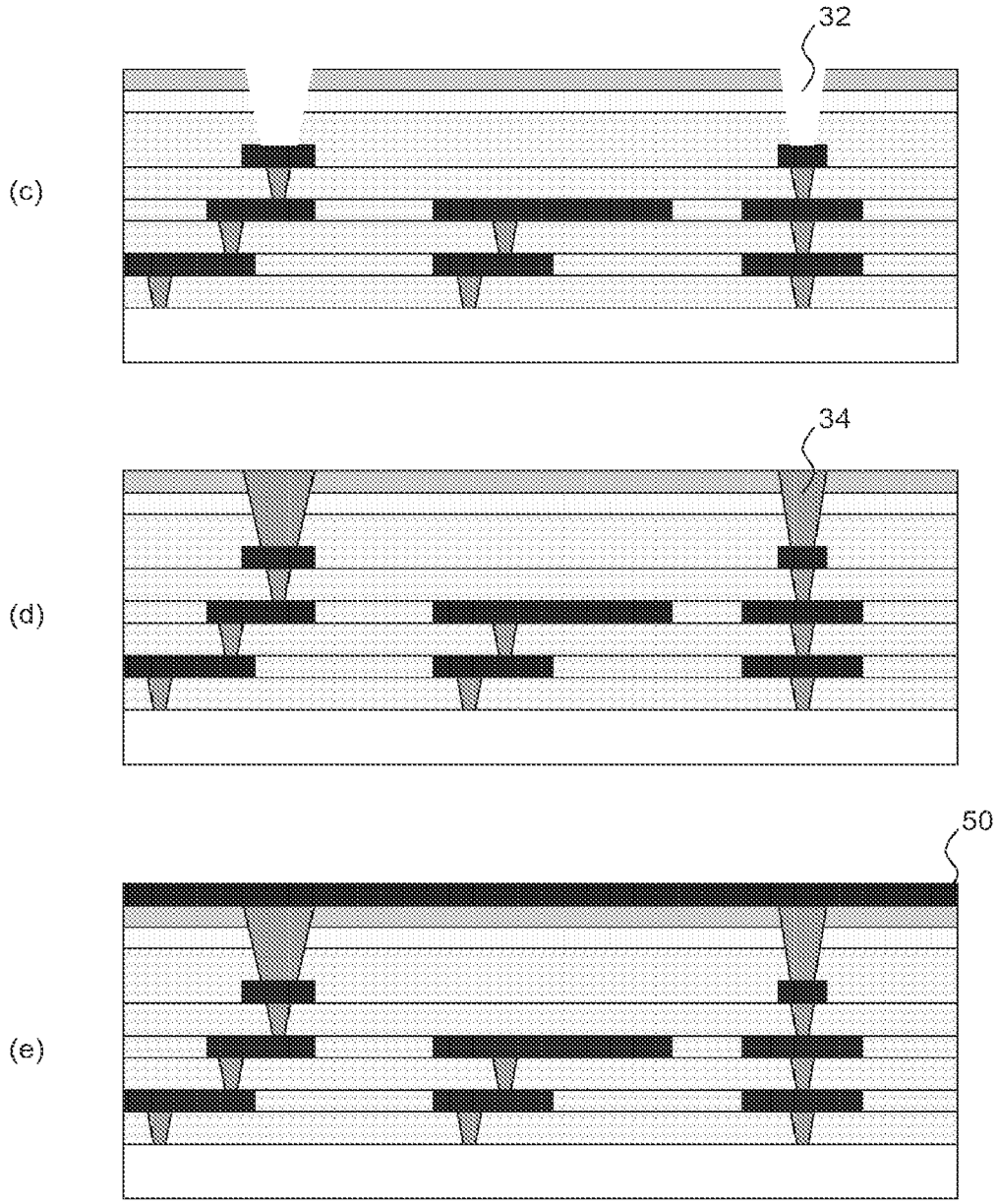
Figure 5:
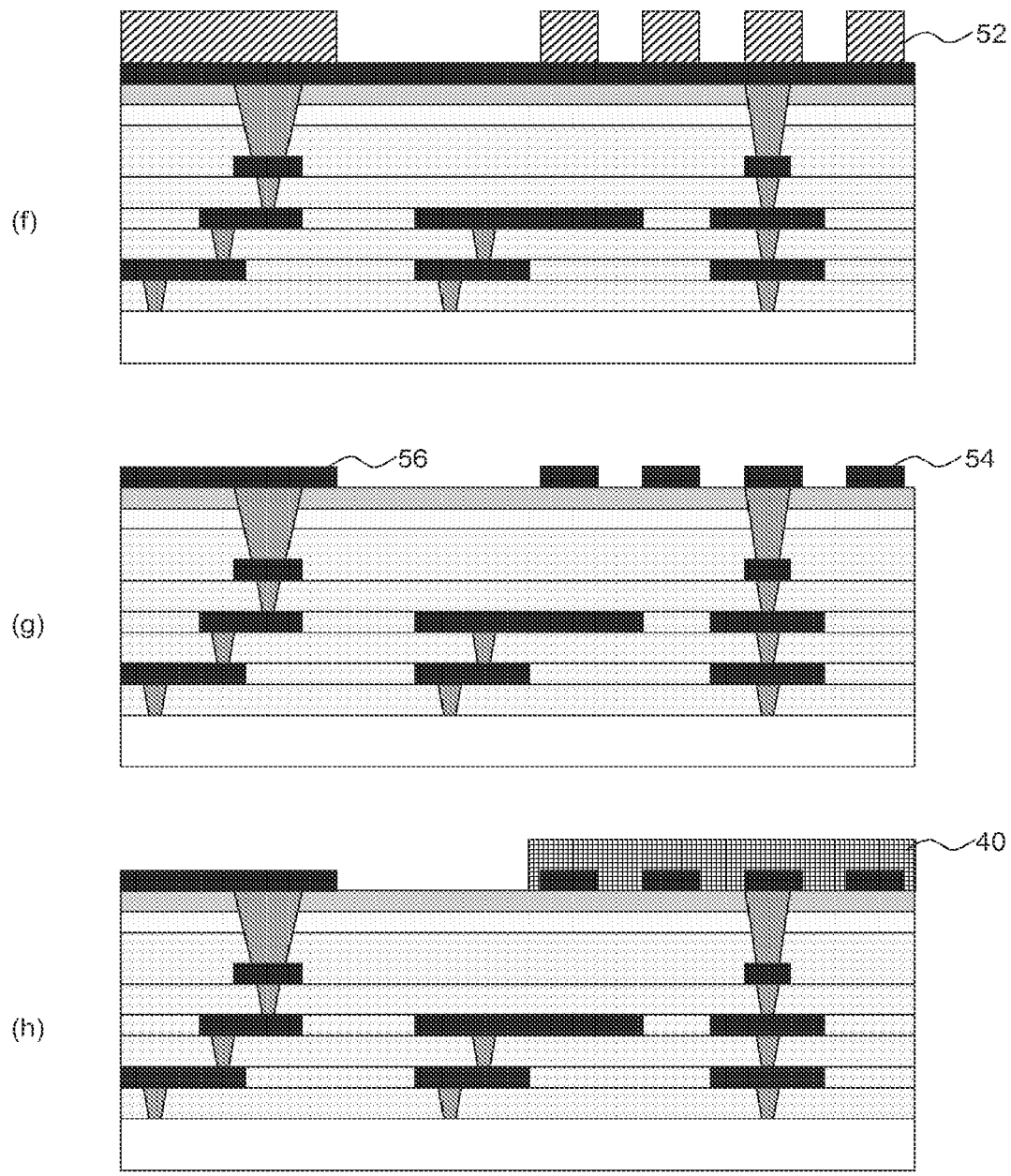
Figure 6:
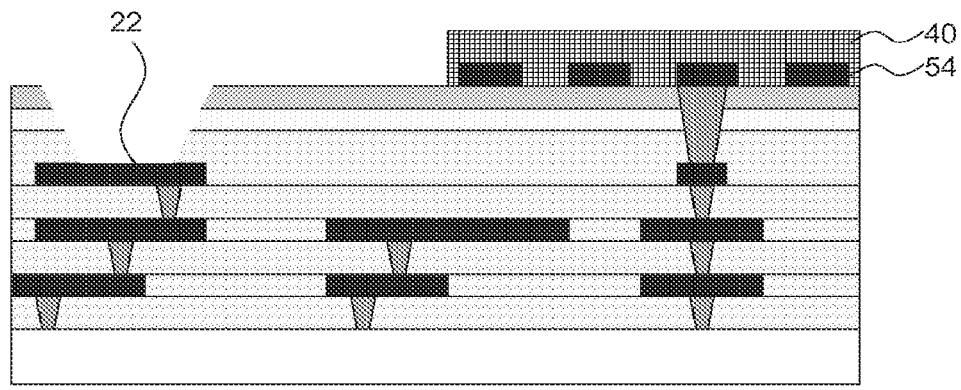
Figure 7:
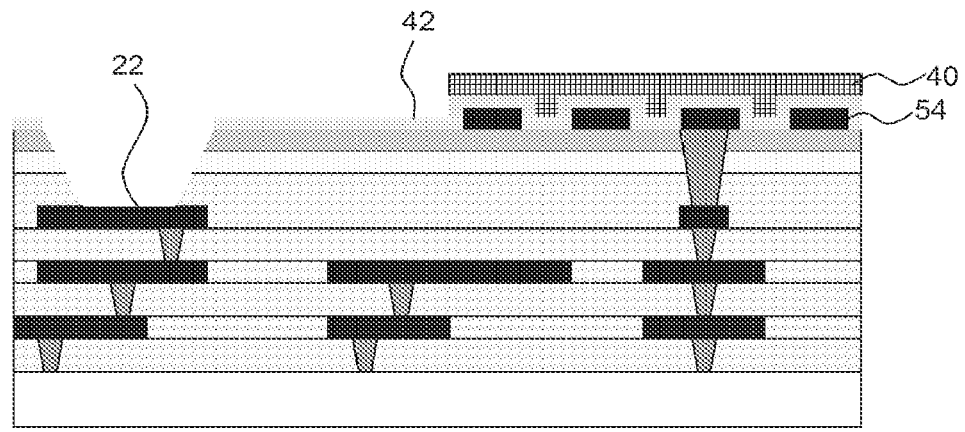

Embodiments of the invention are described in more detail and by way of non-limiting examples with reference to the accompanying drawings, wherein:

FIG. 1 schematically depicts a prior art IC with multiple sensors;

FIG. 2 schematically depicts a method to manufacture an IC with a sensor in accordance with an embodiment of the present invention;

FIG. 3 schematically an IC with a sensor in accordance with another embodiment of the present invention;

FIG. 4 schematically depicts a method to manufacture an IC with a sensor in accordance with yet another embodiment of the present invention;

FIG. 5 schematically depicts a method to manufacture an IC with a sensor in accordance with yet another embodiment of the present invention;

FIG. 6 schematically depicts an IC with a sensor in accordance with yet another embodiment of the present invention; and FIG. 7 schematically depicts an IC with a sensor in accordance with yet another embodiment of the present invention.

DETAILED DESCRIPTION OF THE DRAWINGS

It should be understood that the Figures are merely schematic and are not drawn to scale. It should also be understood that the same reference numerals are used throughout the Figures to indicate the same or similar parts.

FIG. 2 schematically depicts the various steps of a method of manufacturing an IC with an environmental sensor, i.e. a sensor exposed to the environment of the IC in accordance with an embodiment of the present invention, in which an improved protection against moisture penetrating the internals of the IC is achieved. As shown in step (a), an IC may be provided comprising a substrate 10 onto which a metallization stack is formed. Such a metallization stack typically comprises a stack of patterned metal layers 12 electrically insulated from each other by electrically insulating, i.e. dielectric layers 14. Metal portions in different metallization layers 12 may be conductively coupled to each other by means of vias 16 extending through dielectric layers 14 separating such metal portions from each other. The substrate 10 may be any suitable substrate material, e.g. single crystal Si, SiGe, silicon on insulator and so on, and may carry a plurality of circuit elements such as transistors, diodes and so on.

Equally, the metallization stack may be formed in any suitable manner, and may contain any suitable number of metal layers 12 and dielectric layers 14. It should be understood that three metal layers are shown by way of non-limiting example only.

Each metal layer 12 and each dielectric layer 14 is depicted as a single layer in FIG. 2 for the sake of clarity only. It should be appreciated that such layers may consist of a number of stacked sub-layers, for instance in a submicron CMOS process, stacks of Ti, TiN, AlCu, TiN may be used to define a single metal layer in the metallization stack.

Each of the dielectric layers 14 may also comprise more than a single layer. For instance, such a dielectric layer may be a stack comprising FSG (fluorosilicate glass), $SiO_2$ and HDP oxide (High Density Plasma) any other suitable dielectric material combination. Other suitable materials may also be used.

Similarly, it will be apparent that the vias 16 may be formed from more than a single material. For instance, in the aforementioned CMOS 14 technology, a via 16 may be formed by a TiN liner and a W plug. Other semiconductor processes may use different materials, e.g. Cu for the metal layers 12 and vias 16.

In FIG. 2, the upper metal layer of the metallization stack comprises an electrode portion 20 and a bond pad portion 22. In step (b), the metallization stack is covered by a passivation stack, which may comprise the deposition of a high density plasma oxide 24 followed by an oxide planarization step, e.g. a chemical mechanical polishing (CMP) step, after which a $SiO_2$ layer 26 and a $Si_3N_4$ layer 28 may be deposited to any suitable thickness. Other layer materials may also be contemplated for the passivation stack. It is known per se to the skilled person how to form such a passivation stack such that this will not be elaborated upon for reasons of brevity only.

The method proceeds as shown in step (c), in which a resist 30 is deposited onto the passivation stack and subsequently patterned to leave exposed the parts of the passivation stack over the electrode portion 20. Any suitable resist material may be used for this purpose, e.g. a negative resist or a positive resist material. The resultant structure is subsequently subjected to an etch recipe, e.g. a reactive ion etch (RIE), to selectively remove the respective layers of the passivation stack from over the electrode portion 20 such that this portion becomes exposed by trenches 32, after which the patterned resist 30 is stripped from the patterned passivation stack. The resultant structure is shown in step (d).

The trenches 32 are subsequently filled, e.g. by deposition of a TiN layer followed by a tungsten fill of the remainder of the trenches 32 to yield vias 34 extending through the passivation stack, as shown in step (e). The trenches 32 may be filled with tungsten using e.g. a chemical vapor deposition (CVD) process. Other via materials are equally feasible, e.g. Cu vias, which may be advantageous when Cu is used as the metal in the metallization stack.

Next, a resist 36 is applied over the resultant structure as shown in step (f) to open the bond pad portion 22 whilst protecting the remainder of the IC. The resist 36 may be the same material as used for the resist 30 although it is equally feasible to use a different resist material. An etch step may be applied, such as a reactive ion etch stopping on the bond pad metal, e.g. Al, to remove the passivation stack in the areas exposed by the patterned resist 36, after which the resist 36 may be stripped off the passivation stack in any suitable manner. The resultant structure including the opening 38 over the bond pad portion 22 is shown in step (g).

The sensor of the IC may now be completed by the deposition, e.g. spinning and subsequent development, of a sensing material 40 over the through-passivation vias 34, thereby functionalizing the electrodes 20 in the metallization stack. This is shown in step (h). For instance, in case of a relative humidity sensor, the sensing material 40 may be a material that can absorb moisture, which causes a change in the dielectric constant of the sensing material such that the moisture content can be determined capacitively. A non-limiting example of a suitable embodiment of the sensing material 40 is polyimide.

In an alternative embodiment, the formation of the trenches 32 and subsequent formation of the vias 34 as shown in steps (d) and (e) of FIG. 2 may be extended to include the formation of a circular or any other suitably shaped via, i.e. a guard ring 34' through the passivation stack that terminates on the bond pad and surrounds the opening 38 such that the metallization stack is shielded from environmental contact through the side walls of opening 38. The method may subsequently proceed as shown in FIG. 2. The resultant IC is shown in FIG. 3.

FIG. 4 shows an alternative embodiment of the method of the present invention, which shares the steps (a)-(e) of the embodiment shown in FIG. 2. These steps are therefore not shown in FIG. 4 for the sake of brevity. After the formation of the through-passivation vias 34 and subsequent planarization, e.g. by means of CMP, the passivation stack is extended by the deposition of a layer 42 of $Ta_2O_5$ over the resultant structure, as shown in step (a) of FIG. 4. This oxide is known to be moisture-impenetrable such that it provides additional protection against moisture penetration, e.g. through cracks in the through-passivation vias 34. As $Ta_2O_5$ is a so-called high-k dielectric material, its presence under the sensing material 40 reduces sensitivity of the environmental sensor only by a small amount when applying a typical thickness $Ta_2O_5$ layer 42, e.g. a sensitivity reduction of 5-10% for a 25 nm $Ta_2O_5$ layer in the shown configuration.

After formation of the $Ta_2O_5$ layer, the IC may be finalized analogous to the method shown in FIG. 2, i.e. by providing the patterned resist 36 to define the bond pad opening (step (b) of FIG. 4), opening the bond pad 22, e.g. by RIE (step (c) of FIG. 4) and applying the sensing material 40 over the through-passivation vias 34 (step (d) of FIG. 4), with the alteration that the formation of opening 38 now includes removing the additional $Ta_2O_5$ layer from over the bond pad 22. It is noted that although not explicitly shown in FIG. 4, this embodiment of the present invention may further include a guard ring 34' around the bond pad 22.

In order to increase the sensitivity of the sensor, another exemplary embodiment of the present invention includes the provision of one or more electrodes on the passivation stack such that the passivation stack is situated between these electrodes and the metallization stack. This is shown in FIG. 5, where a substrate carrying a metallization stack and a passivation stack is shown in step (a). The metallization stack comprises an electrode portion 20 and a bond pad portion 20' in the upper metallization layer of the metallization stack. The passivation stack comprises a high density plasma oxide layer 24, a $SiO_2$ layer 26 and a $Si_3N_4$ layer as a scratch protection layer by way of non-limiting example only. The use of additional layers (e.g. a $Ta_2O_5$ layer 42 as shown in FIG. 4) and/or different layer materials will be apparent to the skilled person. In the next step shown as step (b), a resist 30 is deposited and patterned such that the passivation stack regions over the electrode portion 20 and a bond pad portion 20' in the upper metallization layer are exposed. The resist 30 may be any suitable material as previously explained.

The resultant structure is subjected to a passivation stack etch recipe, e.g. a ME, to open the passivation stack as shown in step (c). The etch is terminated on the electrode portion 20 and a bond pad portion 20' in the upper metallization layer such that these portions are exposed by the trenches 32 formed in the etch step. The trenches 32 are subsequently filled with a conductive material, which may be preceded by the formation of a liner on the side walls and bottom of the trenches 32. For instance, the trenches 32 may be lined with a TiN liner and subsequently filled with a tungsten plug although it is reiterated that the vias 34 may be formed using any suitable conductive material.

Preferably, the same conductive material is used for the through-passivation vias 34 as for the vias 16 in the metallization stack as this means that the same processing steps used for the formation of the vias 16 may be reused for the vias 34, thus limiting the overall cost of the manufacturing process. After the formation of the through-passivation vias 34 as shown in step (d), which typically includes a CMP planarization step following deposition of the via filler, the method proceeds as shown in step (e) by the deposition of a metal layer 50, e.g. an Al layer, a Cu layer or metal alloy layer such as an AlCu layer over the resultant structure from which external electrodes and bond pads are to be formed by patterning of the metal layer 50. The metal layer 50 may be deposited by any suitable process.

To facilitate patterning of the metal layer 50, a resist 52 is deposited on the metal layer 50 and subsequently developed to expose the parts of the metal layer 50 to be removed, as shown in step (f). Any suitable resist may be used for this purpose. The exposed metal is subsequently removed, e.g. by using an etch recipe such as a RIE and the patterned resist 52 is subsequently stripped from the remaining metal portions to render an IC comprising one or more electrodes 54 and a bond pad 56 on the passivation stack as shown in step (g). The sensor may be completed by the deposition of the sensing material 40 over the one or more electrodes 54 as shown in step (h). The sensing material 40 may be deposited and patterned as previously explained.

In a preferred embodiment, the sensor comprises two interdigitated electrodes 54, e.g. meandering or finger electrodes in which the electrodes are electrically insulated from each other by the moisture-adsorbent sensing material 40, such as polyimide or another suitable electrically insulating material. This effectively provides a capacitor having large surface area capacitor plates in the form of the interdigitated electrodes 54, with the sensing material 40 acting as the dielectric of the capacitor. It should be apparent that aspects of the embodiments of FIG. 2-5 may be combined without departing from the teachings of the present invention. One particular advantageous combination of such aspects is shown in FIG. 6, in which the bond pad portion 22 in the upper metallization layer is used as the actual bond pad instead of a bond pad portion provided on top of the passivation stack. This can be achieved by patterning the metal layer 50 such that only electrodes 54 are formed, after which a resist 36 may be applied to the resultant structure in analogy with step (f) in FIG. 2, followed by a passivation stack opening to form the opening 38 over the bond pad portion 22, and the removal of the resist 36 followed by the deposition of the sensing material 40 as explained in more detail in the detailed description of FIG. 2. The embodiment shown in FIG. 6 is particularly attractive from a cost perspective as it requires limited modification of existing manufacturing processes, in particular CMOS manufacturing processes.

The electrodes 54 may be protected by a $Ta_2O_5$ layer 42 as shown in FIG. 7. This protects the electrodes 54 from corrosion and further improves the moisture hermeticity of the IC. The presence of the $Ta_2O_5$ layer 42 further facilitates the integration of a pH sensor on the same wafer as the environmental sensor of the present invention. The $Ta_2O_5$ layer 42 may be deposited after the patterning of the meandering electrodes 54 and prior to the opening of the bond pad 22 as explained in the description of FIG. 6.

The $Ta_2O_5$ layer 42 may be deposited in any suitable manner, e.g. PVD or CVD. Chemical vapor deposition (CVD) is preferable as this yields a $Ta_2O_5$ layer having superior conformality.

Although the described embodiments have been limited to providing the IC of the present invention with a single environmental sensor, it will be appreciated that other sensors may be included in the IC design without departing from the scope of the present invention.

The IC of the present invention may be integrated in any suitable electronic device, e.g. a mobile communication device such as a mobile phone, personal digital assistant and so on, or may be used as a tag for an article for monitoring purposes, in which case the IC may be extended with RF functionality, e.g. an RF transceiver communicatively coupled to the sensor(s) of the IC.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:
1. An integrated circuit comprising:
   a substrate carrying a plurality of circuit elements;

a metallization stack interconnecting the circuit elements, the metallization stack including a patterned upper metallization layer having a first metal portion;

a passivation stack covering the metallization stack, the passivation stack including a moisture-impenetrable layer and being configured and arranged to mitigate moisture penetration to the metallization stack and ensure operation of the circuit elements; and a sensor including a sensing material deposited on top of the passivation stack, the sensing material being coupled to the first metal portion by a via extending through the passivation stack, wherein the sensor including the sensing material is deposited above the moisture-impenetrable layer, and wherein the passivation stack and the via provide a contiguous moisture barrier over the first metal portion, the contiguous moisture barrier preventing moisture from contacting the first metal portion upon exposure of the sensor to moisture.

2. The integrated circuit of claim 1, wherein the sensing material is deposited over the via.

3. The integrated circuit of claim 1, wherein the passivation stack includes a $Ta_2O_5$ layer, the sensing material being formed on the $Ta_2O_5$ layer.

4. The integrated circuit of claim 3, wherein the sensing material is formed on top of the $Ta_2O_5$ layer.

5. A method of manufacturing an integrated circuit, comprising:

providing a substrate carrying a plurality of circuit elements;

forming a metallization stack interconnecting the circuit elements, the metallization stack including a patterned upper metallization layer having a first metal portion;

forming a passivation stack covering the metallization stack, the passivation stack including a moisture-impenetrable layer and being configured and arranged to mitigate moisture penetration to the metallization stack and ensure operation of the circuit elements;

forming a trench in the passivation stack to expose the first metal portion;

forming a via in the trench; and forming a sensor including a sensing material by depositing the sensing material on top of the passivation stack, the sensing material being coupled to the first metal portion, wherein the sensor including the sensing material is deposited above the moisture-impenetrable layer, and wherein the passivation stack and the via are formed such that they provide a contiguous moisture barrier over the first metal portion, the contiguous moisture barrier preventing moisture from contacting the first metal portion upon exposure of the sensor to moisture.

6. The method according to claim 5, wherein the sensing material is deposited over the via to couple the sensing material to the first metal portion.

7. The method according to claim 5, wherein the passivation stack includes a $Ta_2O_5$ layer, the sensing material being formed on the $Ta_2O_5$ layer.

8. The method according to claim 7, wherein the sensing material is formed on top of the $Ta_2O_5$ layer.

* * * * *